United States Patent
Tsai et al.

(10) Patent No.: US 10,593,246 B2
(45) Date of Patent: Mar. 17, 2020

(54) PIXEL ARRAY SUBSTRATE AND DISPLAY DEVICE

(71) Applicant: E Ink Holdings Inc., Hsinchu (TW)

(72) Inventors: Shu-Fen Tsai, Hsinchu (TW);
Jia-Hung Chen, Hsinchu (TW);
Kuang-Heng Liang, Hsinchu (TW);
Chih-Ching Wang, Hsinchu (TW); Ian French, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/131,057

(22) Filed: Sep. 14, 2018

(65) Prior Publication Data
US 2019/0139476 A1 May 9, 2019

(30) Foreign Application Priority Data

Nov. 8, 2017 (CN) .......................... 2017 1 1088519

(51) Int. Cl.
*G09G 3/20* (2006.01)
*H01L 27/12* (2006.01)

(52) U.S. Cl.
CPC ........ *G09G 3/20* (2013.01); *G09G 2300/0426* (2013.01); *G09G 2300/0439* (2013.01); *G09G 2300/0809* (2013.01); *G09G 2310/0218* (2013.01); *G09G 2310/0278* (2013.01); *G09G 2330/06* (2013.01); *H01L 27/124* (2013.01)

(58) Field of Classification Search
CPC ............. G09G 3/20; G09G 2300/0439; G09G 2300/0426; G09G 2300/0809; G09G 2310/0278; H01L 27/124
See application file for complete search history.

(56) References Cited

U.S. PATENT DOCUMENTS

| 5,319,480 A * | 6/1994 | McCartney | G02F 1/136213 349/144 |
| 5,610,739 A * | 3/1997 | Uno | G02F 1/136213 349/144 |
| 5,777,700 A * | 7/1998 | Kaneko | G02F 1/133753 349/129 |
| 5,903,249 A * | 5/1999 | Koyama | G09G 3/3659 345/92 |
| 6,300,977 B1 * | 10/2001 | Waechter | H04N 5/3741 348/300 |

(Continued)

FOREIGN PATENT DOCUMENTS

| TW | 201205535 | 2/2012 |
| WO | 03100512 | 12/2003 |

*Primary Examiner* — Christopher E Leiby
(74) *Attorney, Agent, or Firm* — JCIPRNET

(57) ABSTRACT

A pixel array substrate includes a substrate, first and second scan lines, data lines, and pixel structures. The first and second scan lines are disposed alternately and are enabled for different time durations in the same frame time. The data lines intersect with the first and second scan lines. Each of the pixel structures includes first and second active devices, and a pixel electrode. The first and second active devices are turned on and off by the first and second scan lines, respectively. The pixel electrode is connected to the first active device which is connected to one of the data lines by being connected to the second active device. A distance between the first and second scan lines adjacent to each other is a third to a half of a pitch of the pixel structures.

18 Claims, 6 Drawing Sheets

(56) References Cited

U.S. PATENT DOCUMENTS

| | | | |
|---|---|---|---|
| 6,982,690 B2* | 1/2006 | Lee | G09G 3/3659 345/87 |
| 7,324,170 B2* | 1/2008 | Baek | G02F 1/134336 349/146 |
| 7,847,773 B2* | 12/2010 | Chiang | G09G 3/3607 345/93 |
| 7,852,302 B2* | 12/2010 | Chiang | G09G 3/3659 345/93 |
| 7,907,131 B2* | 3/2011 | Su | G09G 3/2074 345/204 |
| 7,982,219 B2* | 7/2011 | Kuo | G09G 3/3659 257/347 |
| 7,982,702 B2* | 7/2011 | Kamada | G02F 1/133753 345/89 |
| 8,054,398 B2* | 11/2011 | Kim | G02F 1/13624 349/48 |
| 8,243,108 B2* | 8/2012 | Chen | G09G 3/3614 345/204 |
| 8,395,718 B2* | 3/2013 | Kimura | G02F 1/13624 349/48 |
| 8,441,590 B2* | 5/2013 | Tsubata | G02F 1/136286 349/39 |
| 8,542,330 B2* | 9/2013 | Kimura | G02F 1/136213 349/39 |
| 8,581,821 B2* | 11/2013 | Kamada | G09G 3/3611 345/100 |
| 8,792,064 B2* | 7/2014 | Ting | G02F 1/13624 349/144 |
| 9,129,865 B2* | 9/2015 | Chi | H01L 27/124 |
| 9,195,107 B2* | 11/2015 | Kim | G02F 1/134363 |
| 9,360,692 B2* | 6/2016 | No | G09G 3/3659 |
| 9,360,722 B2* | 6/2016 | Kimura | G02F 1/13624 |
| 9,459,445 B1 | 10/2016 | Notermans et al. | |
| 2003/0117422 A1* | 6/2003 | Hiyama | G09G 3/3607 345/690 |
| 2004/0141099 A1 | 7/2004 | Kim et al. | |
| 2005/0001805 A1* | 1/2005 | Jeon | G02F 1/136286 345/92 |
| 2005/0036091 A1* | 2/2005 | Song | G02F 1/133707 349/129 |
| 2005/0140638 A1* | 6/2005 | Lee | G09G 3/3659 345/100 |
| 2006/0034125 A1* | 2/2006 | Kim | G09G 3/3648 365/185.22 |
| 2006/0103800 A1* | 5/2006 | Li | G02F 1/1393 349/129 |
| 2006/0192739 A1* | 8/2006 | Shin | G09G 3/3607 345/90 |
| 2006/0215066 A1* | 9/2006 | Ueda | G02F 1/134309 349/38 |
| 2006/0274008 A1* | 12/2006 | Lin | G09G 3/3659 345/92 |
| 2007/0013854 A1 | 1/2007 | Yoo et al. | |
| 2008/0123002 A1* | 5/2008 | Yeh | G02F 1/136286 349/37 |
| 2008/0246720 A1* | 10/2008 | Lee | G02F 1/133555 345/96 |
| 2008/0278424 A1* | 11/2008 | Kim | G09G 3/3648 345/92 |
| 2010/0220116 A1* | 9/2010 | Liao | G09G 3/3659 345/690 |
| 2011/0085105 A1* | 4/2011 | Park | G02F 1/1333 349/54 |
| 2011/0170031 A1* | 7/2011 | Son | G09G 3/3659 349/46 |
| 2011/0221988 A1* | 9/2011 | Cho | G02F 1/134363 349/41 |
| 2012/0026415 A1* | 2/2012 | Tsubata | G02F 1/136213 348/790 |
| 2014/0313444 A1* | 10/2014 | Kimura | G02F 1/13624 349/42 |
| 2016/0188061 A1 | 6/2016 | Cho et al. | |
| 2018/0315388 A1* | 11/2018 | Han | H01L 27/124 |

\* cited by examiner

PIXEL ARRAY SUBSTRATE AND DISPLAY DEVICE

CROSS-REFERENCE TO RELATED APPLICATION

This application claims the priority benefit of China application serial no. 201711088519.X, filed on Nov. 8, 2017. The entirety of the above-mentioned patent application is hereby incorporated by reference herein and made a part of this specification.

BACKGROUND OF THE DISCLOSURE

1. Field of the Disclosure

The disclosure relates to a pixel array substrate and a display device.

2. Description of Related Art

With the development of display technology and diversification of various display devices, in order to obtain a larger image display area in a display device having limited volume, demand for the display panel of the display device without frames on margins grows more and more desperate. However, for the layout of a circuit meeting the demand for the frameless display panel, coupling induction between adjacent lines transmitting different drive signals often causes a fluctuation disturbance in signals, so display quality is affected.

SUMMARY OF THE DISCLOSURE

The disclosure provides a pixel array substrate capable of effectively reducing coupling induction between scan lines that leads to a fluctuation disturbance between drive signals.

The disclosure provides a display device having higher display quality due to use of the pixel array substrate.

The pixel array substrate according to an embodiment of the disclosure includes a substrate, first scan lines, second scan lines, data lines and pixel structures. The first scan lines and the second scan lines are disposed alternately and enabled for different time durations in the same frame time. The data lines intersect with the first scan lines and the second scan lines. The pixel structure is disposed on the substrate and arranged in an array. Each of the pixel structures includes a first active device, a second active device and a pixel electrode. The first active device is turned on and off by the one of the corresponding first scan lines, while the second active device is turned on and off by the one of the corresponding second scan lines. The pixel electrode is connected to the first active device which is connected to the one of data lines by being connected to the second active device, and the first active device is connected to one of the data lines. A distance between the first scan line and the second scan line adjacent to each other is a third to a half of a pitch of the pixel structures.

According to an embodiment of the disclosure, the pixel array substrate further includes a gate drive circuit that is disposed on the substrate and includes gate block signal lines and N gate selection signal lines. N consecutive first scan lines are classified as a first scan line group, each of the first scan line groups is connected to an identical one gate block signal line, N consecutive second scan lines are connected to N gate selection signal lines sequentially, N is a positive integer, and the N gate selection signal lines are enabled sequentially within a time duration of each of the gate block signal lines being enabled.

According to an embodiment of the disclosure, each of the pixel structures further includes a pad electrode and a common electrode. The pad electrode is disposed on the substrate and electrically connected to the pixel electrode. The commonelectrode is disposed on the substrate and between the pad electrode and the pixel electrode.

According to an embodiment of the disclosure, the pad electrode includes a first pad electrode and a second pad electrode. An orthographic projection of the first pad electrode on the substrate does not overlap with an orthographic projection of the second pad electrode on the substrate, and one corresponding second scan line is provided between the first pad electrode and the second pad electrode.

According to an embodiment of the disclosure, the common electrode includes a first common electrode and a second common electrode. An orthographic projection of the first common electrode on the substrate overlaps with an orthographic projection of the first pad electrode on the substrate, and an orthographic projection of the second common electrode on the substrate overlaps with an orthographic projection of the second pad electrode on the substrate.

According to an embodiment of the disclosure, each of the pixel structures further includes a gate insulating layer and a connecting electrode. The gate insulating layer covers a gate of the first active device, a gate of the second active device, and the pad electrode. The gate insulating layer includes a first gate insulating layer opening exposing a portion of the first pad electrode and a second gate insulating layer opening exposing a portion of the second pad electrode. The connecting electrode is disposed on the gate insulating layer and electrically connected to a drain of the second active device and moreover, the connecting electrode is connected to the first pad electrode through the first gate insulating layer opening and connected to the second pad electrode through the second gate insulating layer opening.

According to an embodiment of the disclosure, each of the pixel structures further includes a protective layer. The protective layer covers the first active device and the second active device and has a protective layer opening. The pixel electrode is electrically connected to the connecting electrode through the protective layer opening.

According to an embodiment of the disclosure, the protective layer includes a first protective layer opening and a second protective layer opening. The first protective layer opening is disposed above the first gate insulating layer opening, while the second protective layer opening is disposed above the second gate insulating layer opening.

According to an embodiment of the disclosure, the connecting electrode and the drain of the second active device are integrated.

According to an embodiment of the disclosure, the second scan line correspondingly connected to each of the pixel structures is disposed between the first gate insulating layer opening and the second gate insulating layer opening.

A display device according to an embodiment of the disclosure includes the pixel array substrate as previously mentioned and a display medium disposed on the pixel array substrate.

In view of the above, for the pixel array substrate according to the embodiments of the disclosure, a distance between the first scan line and the second scan line adjacent to each other is a third to a half of a pitch of the pixel structures. In this regard, it is possible to prevent the problem of a disturbance in signals caused by the coupling induction due to the overly close distance between the first scan line and the second scan line adjacent to each other, and the display device using the pixel array substrate has higher display quality.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
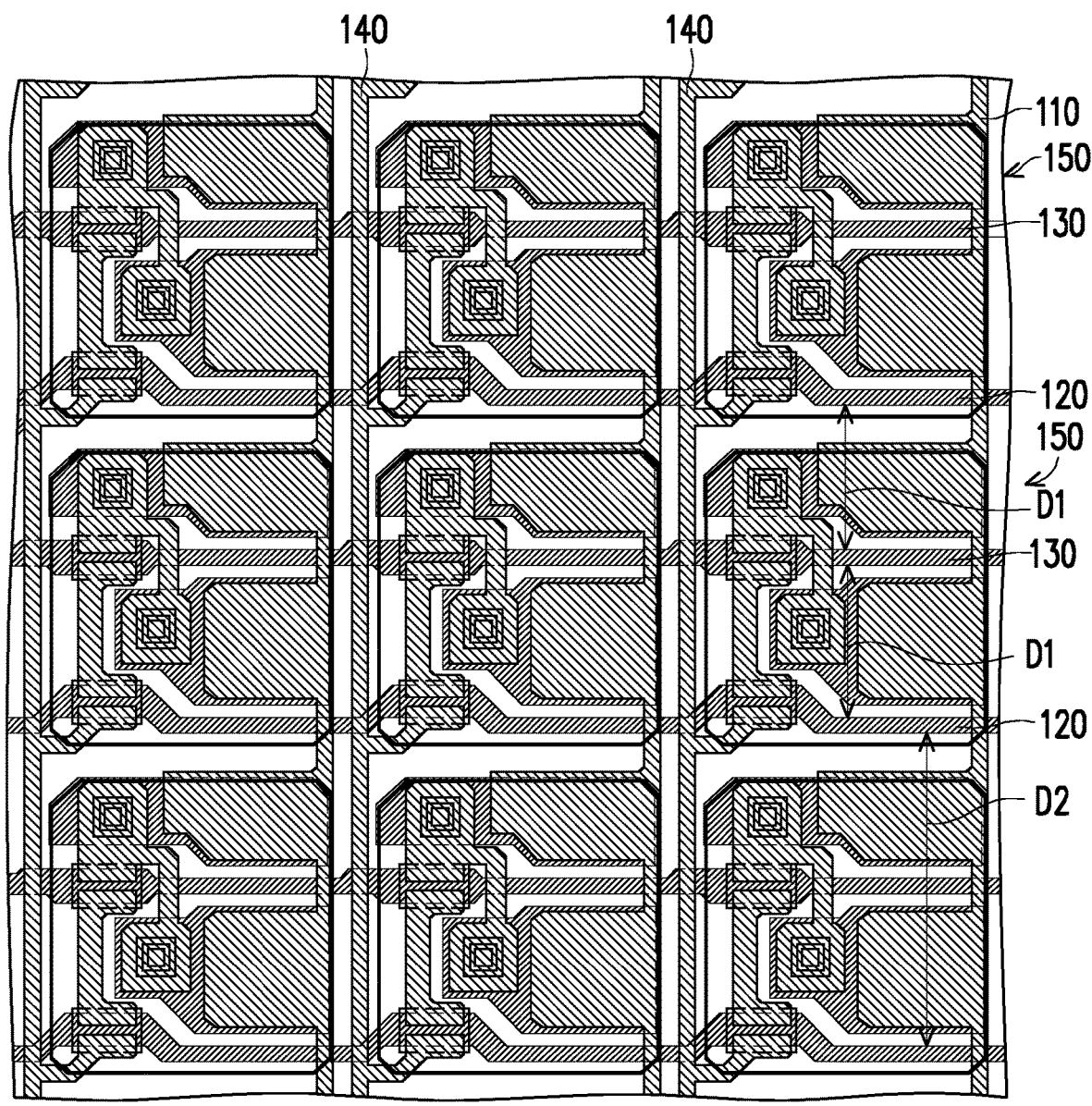
FIG. 1 is a top view of a display device according to an embodiment of the disclosure.

Reference will now be made in detail to the present preferred embodiments of the disclosure, examples of which are illustrated in the accompanying drawings.

Wherever possible, the same reference numbers are used in the drawings and the description to refer to the same or like parts.

Figure 2:
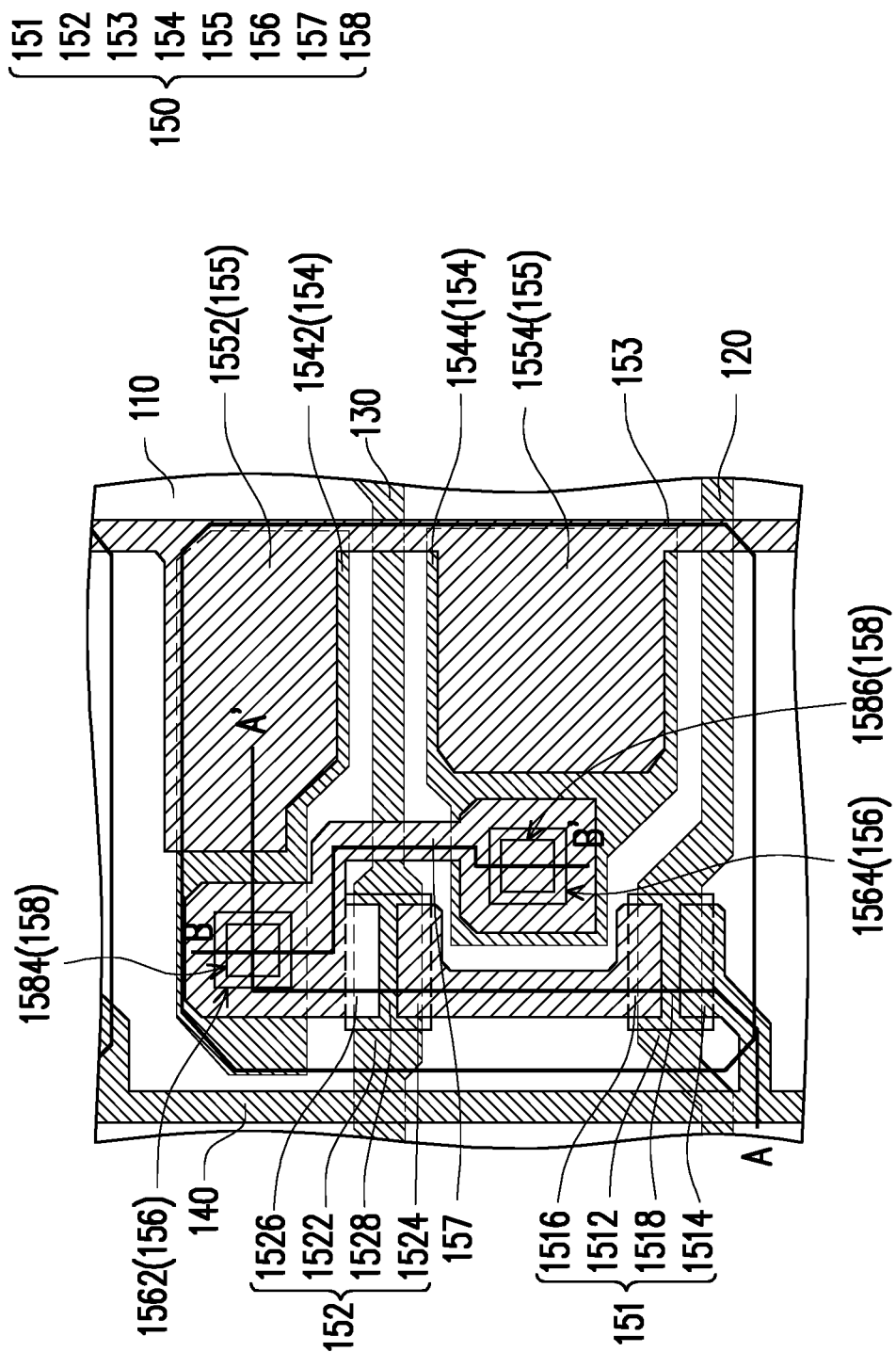
FIG. 2 is a partially enlarged view of the display device of FIG. 1.
Figure 3:
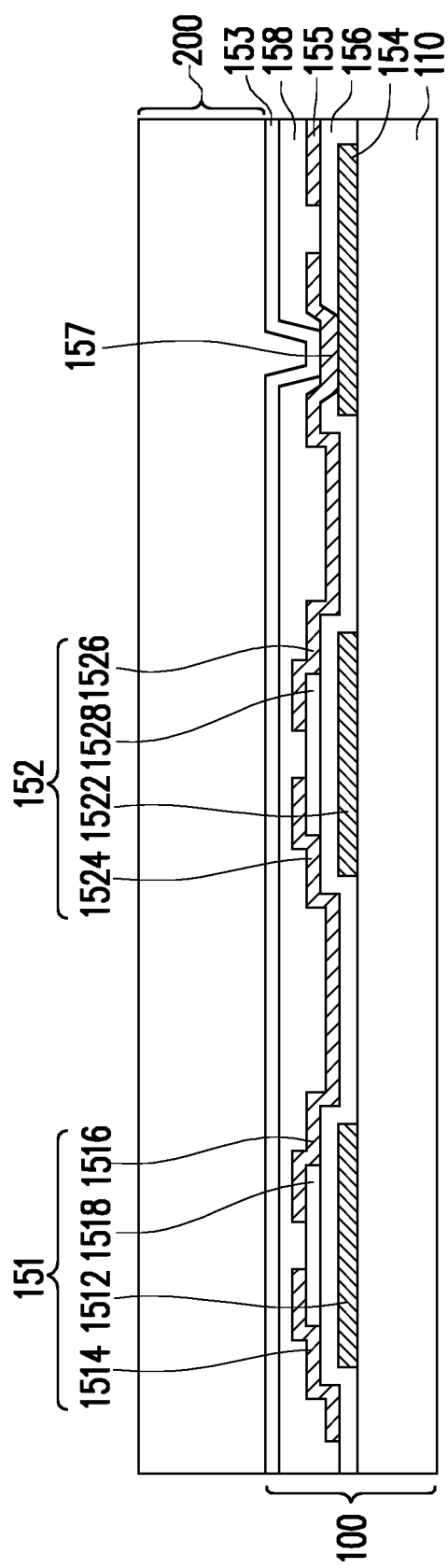
FIG. 3 is a cross-sectional view taken along line A-A' of the display device of FIG. 2.
Figure 4:
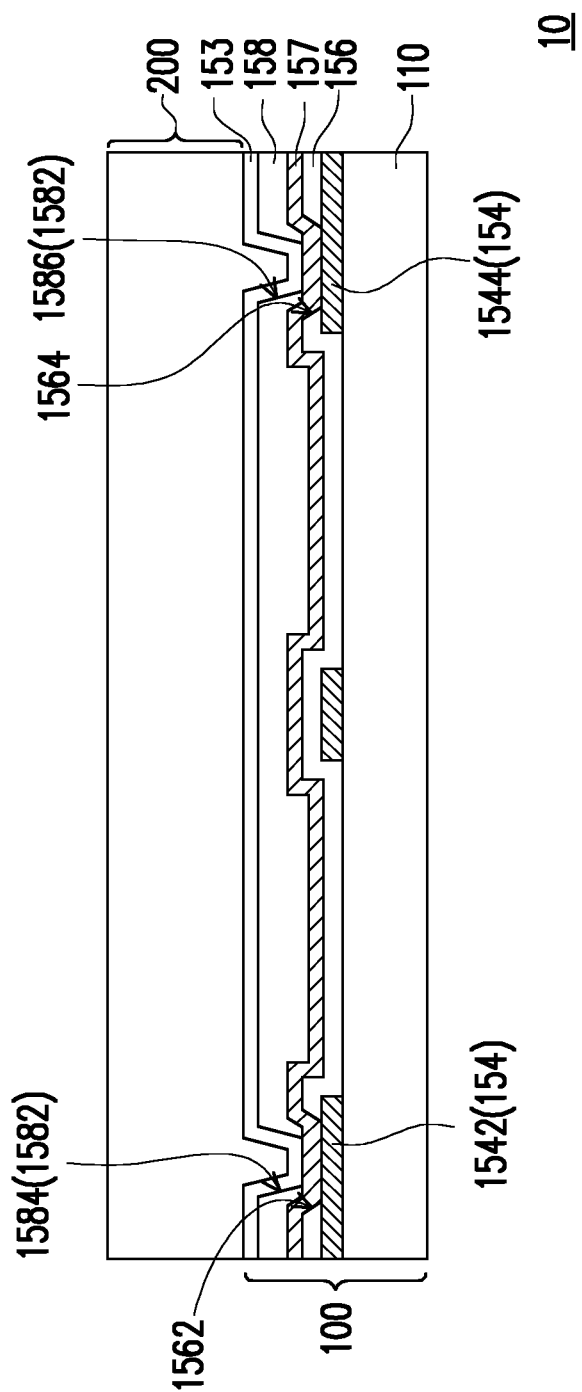
FIG. 4 is a cross-sectional view taken along line B-B' of the display device of FIG. 2.

FIG. 1 is a top view of a display device according to an embodiment of the disclosure. FIG. 2 is a partially enlarged view of the display device of FIG. 1. FIG. 3 is a cross-sectional view taken along line A-A' of the display device of FIG. 2. FIG. 4 is a cross-sectional view taken along line B-B' of the display device of FIG. 2. FIGS. 3 and 4 are drawings showing the cross section of the display device taken along the lines A-A' and B-B' respectively. For illustration purpose, some elements are omitted from FIGS. 1 and 2 (such as a display medium 200 shown in FIGS. 3 and 4). The display device 10 according to the embodiment of the disclosure includes a pixel array substrate 100 and the display medium 200 shown in FIGS. 3 and 4, and the display medium 200 is disposed on the pixel array substrate 100. In this regard, the display medium 200 includes, but is not limited to, an electrophoretic display film or electrowetting display film.

Referring to FIGS. 1 to 3 at the same time, the pixel array substrate 100 according to the embodiment of the disclosure includes a substrate 110, first scan lines 120, second scan lines 130, data lines 140 and pixel structures 150. The first scan lines 120 and the second scan lines 130 are disposed alternately. The date lines 140 intersect with the first scan lines 120 and the second scan lines 130. The pixel structures 150 are disposed on the substrate 110 and arranged in an array. Each of the pixel structures 150 includes a first active device 151, a second active device 152, and a pixel electrode 153. The first active device 151 is turned on and off by one corresponding first scan line 120, while the second active device 152 is turned on and off by one corresponding second scan line 130. The pixel electrode 153 is connected to the first active device 151 that is connected to one data line 140 by being connected to the second active device 152. A distance D1 between the first scan line 120 and the second scan line 130 adjacent to each other is a third to a half of a pitch D2 of the pixel structures 150. Thus, keeping the first scan line 120 from the second scan line 130 by a distance prevents the coupling induction of the first scan line 120 and the second scan line 130 that leads to a disturbance in signals of the first scan line 120 and the second scan line 130 and affects the display quality. Further, a region of the pixel structure may be demarked by the scan lines and the data lines on the substrate, so the pitch of the pixel structures may be defined by the scan lines. According to the embodiment of the disclosure, the pitch D2 of the pixel structures 150 is, but not limited to, defined by two first scan lines 120 adjacent to each other.

Referring to FIGS. 2 and 3, the first active device 151 includes a gate 1512, a source 1514, a drain 1516 and an active layer 1518. The second active device 152 includes a gate 1522, a source 1524, a drain 1526 and an active layer 1528. Orthographic projections of the gate 1512 and the active layer 1518 on the substrate 110 overlap with each other, and the source 1514 and the drain 1516 contact different portions of the active layer 1518. Orthographic projections of the gate 1522 and the active layer 1528 on the substrate 110 overlap with each other, and the source 1524 and the drain 1526 contact different portions of the active layer 1528. In this regard, the configuration and functions of each element of the first active device 151 are the same as the configuration and functions of each element of the second active device 152, and the gate 1512 and the gate 1522 are formed by the same film layer, the active layer 1518 and the active layer 1528 are fonned by the same film layer, and the source 1514, the source 1524, the drain 1516 and the drain 1526 are formed by the same film layer, but the embodiment is not limited thereto. According to the embodiment of the disclosure, the gate 1512 and the gate 1522 are disposed on the substrate 110, and materials of the gate 1512 and the gate 1522 are, for instance, metals. The active layer 1518 and the active layer 1528 are disposed above the gate 1512 and the gate 1522 respectively as channels. Materials of the source 1514, the source 1524, the drain 1516, and the drain 1526 are, for instance, metals.

According to the embodiment of the disclosure, each of the pixel structures 150 further includes a pad electrode 154 and a common electrode 155. The pad electrode 154 is disposed on the substrate 110 and electrically connected to the pixel electrode 153. The pad electrode 154 includes a first pad electrode 1542 and a second pad electrode 1544. An orthographic projection of the first pad electrode 1542 on the substrate 110 does not overlap with an orthographic projection of the second pad electrode 1544 on the substrate 110, and the corresponding second scan line 130 is provided between the first pad electrode 1542 and the second pad electrode 1544. According to the embodiment of the disclosure, the first pad electrode 1542 and the second pad electrode 1544 may be made of the same film layer as the gate 1512 and the gate 1522.

The common electrode 155 is disposed on the substrate 110 and between the pad electrode 154 and the pixel electrode 153, and includes a first common electrode 1552 and a second common electrode 1554. An orthographic projection of the first common electrode 1552 on the substrate 110 overlaps with an orthographic projection of the first pad electrode 1542 on the substrate 110, and an orthographic projection of the second common electrode 1554 on the substrate 110 overlaps with an orthographic projection of the second pad electrode 1544 on the substrate 110. In this regard, the first common electrode 1552, the second common electrode 1554, the source 1514, the source 1524, the drain 1516, and the drain 1526 may be made of the same film layer.

Referring to FIGS. 2 to 4, according to the embodiment of the disclosure, each of the pixel structures 150 further includes a gate insulating layer 156 and a connecting electrode 157. The gate insulating layer 156 covers the gate 1512 of the first active device 151, the gate 1522 of the second active device 152, and the pad electrode 154. The gate insulating layer 156 includes a first gate insulating layer opening 1562 exposing a portion of the first pad electrode 1542 and a second gate insulating layer opening 1564 exposing a portion of the second pad electrode 1544. A material of the gate insulating layer 156 may be, for instance, silicon oxide, silicon nitride or other appropriate dielectric materials. The connecting electrode 157 is disposed on the gate insulating layer 156, electrically connected to the drain 1526 of the second active device 152 and extends between the first gate insulating layer opening 1562 and the second gate insulating layer opening 1564. Moreover, the connecting electrode 157 is connected to the first pad electrode 1542 through the first gate insulating layer opening 1562, and connected to the second pad electrode 1544 through the second gate insulating layer opening 1564. In this regard, according to the embodiment of the disclosure, the connecting electrode 157 and the drain 1526 of the second active device 152 are integrated, and the source 1514, the source 1524, the drain 1516, the drain 1526, and the connecting electrode 157 may be made of the same film layer.

According to the embodiment of the disclosure, each of the pixel structures 150 further includes a protective layer 158. The protective layer 158 covers the first active device 151 and the second active device 152 and has a protective layer opening 1582. The pixel electrode 153 is electrically connected to the connecting electrode 157 through the protective layer opening 1582. Take the protective layer opening 1582, including the first protective layer opening 1584 and the second protective layer opening 1586, for example, the first protective layer opening 1584 is disposed above the first gate insulating layer opening 1562, and the second protective layer opening 1586 is disposed above the second gate insulating layer opening 1564. The pixel electrode 153 is electrically connected to the first pad electrode 1542 through the connecting electrode 157 that fills in the first gate insulating opening 1562 and moreover, the pixel electrode 153 is electrically connected to the second pad electrode 1544 through the connecting electrode 157 that fills in the second gate insulating opening 1564, but the embodiment is not limited thereto. According to other embodiments of the disclosure, one of the first protective layer opening 1584 and the second protective layer opening 1586 may be left out.

Figure 5:
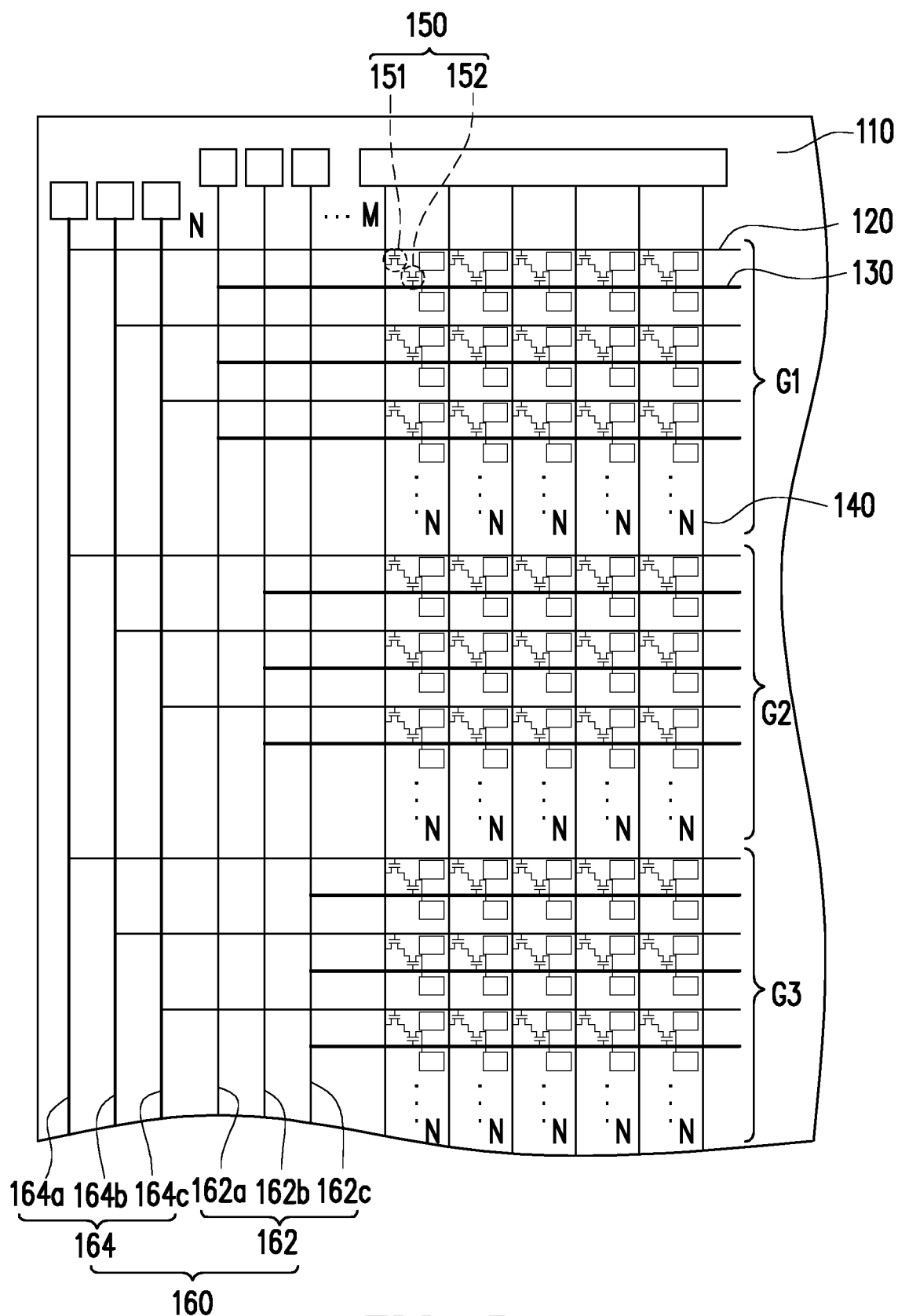
FIG. 5 is a schematic view of equivalent circuits of a pixel array substrate according to an embodiment of the disclosure.
Figure 6:
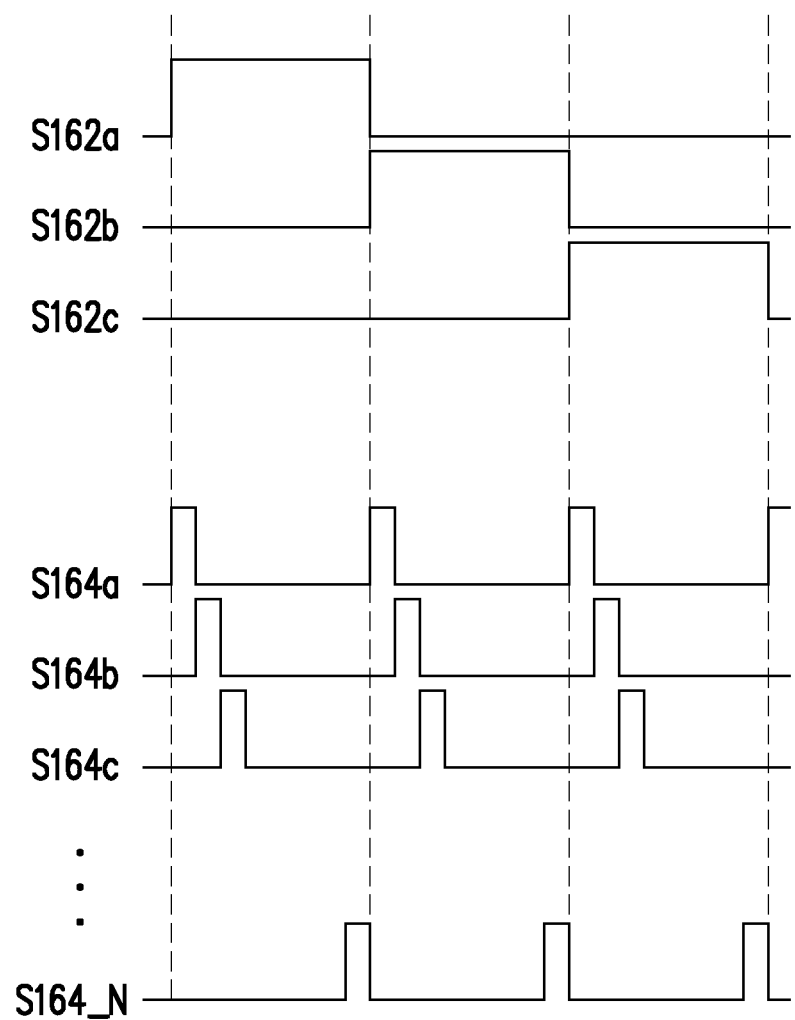
FIG. 6 is a schematic diagram showing the signals of a gate drive circuit according to an embodiment of the disclosure.

FIG. 5 is a schematic view of equivalent circuits of a pixel array substrate according to an embodiment of the disclosure. FIG. 6 is a schematic view of signals of a gate drive circuit according to an embodiment of the disclosure. Referring to FIGS. 5 and 6 at the same time, according to the embodiment of the disclosure, the pixel array substrate 100 further includes a gate drive circuit 160. The gate drive circuit 160 is disposed on the substrate 110, and includes M gate block signal lines 162 and N gate selection signal lines 164, and N and M are positive integers. N consecutive first scan lines 120 are classified as first scan line groups G1, G2, and G3, each of the first scan line groups G1, G2, and G3 is connected to the same gate selection signal line 164, and different first scan line groups G1, G2, and G3 are connected to the different gate selection signal lines 164. N consecutive second scan lines 130 are connected to the N gate block signal lines 162 sequentially. According to the embodiment of the disclosure, the first active device 151 is connected to the gate selection signal line 164 through the first scan line 120, while the second active device 152 is connected to the gate block signal line 162 through the second scan line 130. Moreover, the gate drive circuit 160 may be driven with the signals shown in FIG. 6, so the first scan line 120 and the second scan line 130 are enabled for different time durations in the same frame time, and the N gate selection signal lines 164 are enabled sequentially within the time duration of each of the gate block signal lines 162 being enabled.

Specifically, three of the gate block signal lines 162 and the gate selection signal lines 164 are shown as examples in FIG. 5 respectively, but the embodiment is not limited thereto. The second scan line 130 of the first scan line group G1 is connected to a gate block signal line 162a, the second scan line 130 of the first scan line group G2 is connected to a gate block signal line 162b, and the second scan line 130 of the first scan line group G3 is connected to a gate block signal line 162c. Accordingly, the second scan line 130 of each of the first scan line groups is connected to the corresponding gate block signal line 162. In addition, the first scan line 120, the top one, of the first scan line group G1 is connected to the first gate selection signal line 164a, the first scan line 120, the second one from the top, of the first scan line group G1 is connected to a second gate selection signal line 164b, and the first scan line 120, the third one from the top, of the first scan line group G1 is connected to a third gate selection signal line 164c. Accordingly, the first scan line 120, the N-th one from the top, of the first scan line group G1 is connected to the N-th gate selection signal line 164. In other words, the gate selection signal line 164 of the gate drive circuit 160 is configured to control the signal input of the first scan line 120, and the gate block signal line 162 is configured to control the signal input of the second scan line 130. In this regard, the gate drive circuit 160 may be a multiplexing drive circuit. In other words, the first scan line 120 and the second scan line 130 have different input signals.

Referring to FIG. 6, signals S162a, S162b, S162c and more sequentially enable the corresponding the gate block signal line 162a, the corresponding the gate block signal line 162b, and the corresponding the gate block signal line 162c and more. Moreover, signals S164a, S164b, S164c . . . and S164n also enable the gate selection signal line 164a, the gate selection signal line 164b, the gate selection signal line 164c . . . and the gate selection signal line 164n. The N gate selection signal lines 164 are sequentially enabled within time durations of each of the gate block signal line 162a, the gate block signal line 162b, and the gate block signal line 162c, but the embodiment is not limited thereto.

For instance, referring to FIGS. 2, 5, and 6 at the same time, when the signal S162a transmitted by the gate block signal line 162a activates the second active device 152, the second scan line 130 of the first scan line group G1 is considered to be enabled. Meanwhile, when the signal S164a transmitted by the gate selection signal line 164a activates the first active device 151, the first scan line 120, the top one, of the first scan line group G1 is considered to be enabled. As a result, the first active device 151 and the second active device 152 in the first row of the pixel structures 150 of the first scan line group G1 are activated at the same time. In this regard, signals on the data line 140 may be transmitted to the corresponding pixel electrodes 153 through the activated first active device 151 and the activated second active device 152, so the display medium 200 shown in FIG. 3 turns predetermined grayscale according to the signals received by the corresponding pixel electrodes 153 to perform the function of screen display.

According to the embodiment of the disclosure, in the same frame time, the time duration of the gate block signal line 162 being enabled is N times more than the time duration of the gate selection signal line 164 being enabled. In other words, the time duration of the second scan line 130 being enabled is N times more than the time duration of the first scan line 120 being enabled. Due to a certain distance between the first scan line 120 and the second scan line 130, a disturbance in the signals between the first scan line 120 and the second scan line 130 may decrease, and fluctuations may be prevented. Therefore, the display device 10 according to the embodiment of the disclosure may be of ideal display quality. In addition, with the design of the gate drive circuit 160 of the gate block signal line 162 and of the gate selection signal line 164, gate signals of N×M pixel structures 150 may be transmitted with merely the M gate block signal lines 162 and the N gate selection signal lines 164. As a result, the display device 10 may have narrow frame or border that helps to enhance the proportion of a display area.

In view of the foregoing, for the pixel array substrate according to the embodiments of the disclosure, the distance between the first scan line and the second scan line adjacent to each other is a third to a half of the pitch of the pixel structures. Therefore, it is possible to prevent the problem of a disturbance in the signals caused by the coupling induction between the first scan line and the second scan line due to too close a distance between the first scan line and the second scan line and moreover, the display device with the pixel array substrate has higher display quality.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A pixel array substrate, comprising:
    a substrate;
    a plurality of first scan lines;
    a plurality of second scan lines, wherein the first scan lines and the second scan lines are disposed alternately and enabled for different time durations in the same frame time;
    a plurality of data lines, intersecting with the first scan lines and the second scan lines; and
    a plurality of pixel structures, disposed on the substrate and arranged in an array, each of the pixel structures comprising:
        a first active device, controlled by the one of corresponding first scan lines;
        a second active device, controlled by the one of corresponding second scan lines;
        a pixel electrode, connected to the second active device, and the first active device being connected to the one of data lines; and
    a gate drive circuit disposed on the substrate and comprising a plurality of gate block signal lines and a plurality of gate selection signal lines,
    wherein a distance between the first scan line and the second scan line adjacent to each other is a third to a half of a pitch of the pixel structures, N consecutive first scan lines are classified as a first scan line group, each of the first scan line groups is connected to an identical one gate block signal line, N consecutive second scan lines are connected to N gate selection signal lines sequentially, N is a positive integer, and the N gate selection signal lines are enabled sequentially within a time duration of each of the gate block signal lines being enabled.

2. The pixel array substrate according to claim 1, wherein each of the pixel structures further comprises:
    a pad electrode, disposed on the substrate and electrically connected to the pixel electrode; and
    a common electrode, disposed on the substrate and between the pad electrode and the pixel electrode.

3. The pixel array substrate according to claim 2, wherein the pad electrode comprises a first pad electrode and a second pad electrode, wherein an orthographic projection of the first pad electrode on the substrate does not overlap with an orthographic projection of the second pad electrode on the substrate, and a corresponding second scan line is provided between the first pad electrode and the second pad electrode.

4. The pixel array substrate according to claim 3, wherein the common electrode comprises a first common electrode and a second common electrode, an orthographic projection of the first common electrode on the substrate overlaps with an orthographic projection of the first pad electrode on the substrate, and an orthographic projection of the second common electrode on the substrate overlaps with an orthographic projection of the second pad electrode on the substrate.

5. The pixel array substrate according to claim 3, wherein each of the pixel structures further comprises:
    a gate insulating layer, covering a gate of the first active device, a gate of the second active device, and the pad electrode, wherein the gate insulating layer comprises a first gate insulating layer opening exposing a portion of the first pad electrode and a second gate insulating layer opening exposing a portion of the second pad electrode; and
    a connecting electrode, disposed on the gate insulating layer and electrically connected to a drain of the second active device, wherein the connecting electrode is connected to the first pad electrode through the first gate insulating layer opening and connected to the second pad electrode through the second gate insulating layer opening.

6. The pixel array substrate according to claim 5, wherein each of the pixel structures further comprises:
    a protective layer, covering the first active device and the second active device and having a protective layer opening, wherein the pixel electrode is electrically connected to the connecting electrode through the protective layer opening.

7. The pixel array substrate according to claim 6, wherein the protective layer comprises a first protective layer opening, disposed above the first gate insulating layer opening, and a second protective layer opening, disposed above the second gate insulating layer opening.

8. The pixel array substrate according to claim 5, wherein the connecting electrode and the drain of the second active device are integrated.

9. The pixel array substrate according to claim 5, wherein the second scan line correspondingly connected to each of the pixel structures is disposed between the first gate insulating layer opening and the second gate insulating layer opening.

10. A display device, comprising a pixel array substrate and a display medium disposed on the pixel array substrate, wherein the pixel array substrate comprises:
   a substrate;
   a plurality of first scan lines;
   a plurality of second scan lines, wherein the first scan lines and the second scan lines are disposed alternately and enabled for different time durations in the same frame time;
   a plurality of data lines, intersecting with the first scan lines and the second scan lines; and
   a plurality of pixel structures, disposed on the substrate and arranged in an array, each of the pixel structures comprising:
      a first active device, controlled by the one of corresponding first scan lines;
      a second active device, controlled by the one of corresponding second scan lines;
      a pixel electrode, connected to the second active device, and the first active device being connected to the one of data lines; and
   a gate drive circuit disposed on the substrate and comprising a plurality of gate block signal lines and a plurality of gate selection signal lines,
   wherein a distance between the first scan line and the second scan line adjacent to each other is a third to a half of a pitch of the pixel structures, N consecutive first scan lines are classified as a first scan line group, each of the first scan line groups is connected to an identical one gate block signal line, N consecutive second scan lines are connected to N gate selection signal lines sequentially, N is a positive integer, and the N gate selection signal lines are enabled sequentially within a time duration of each of the gate block signal lines being enabled.

11. The display device according to claim 10, wherein each of the pixel structures further comprises:
   a pad electrode, disposed on the substrate and electrically connected to the pixel electrode; and
   a common electrode, disposed on the substrate and between the pad electrode and the pixel electrode.

12. The display device according to claim 11, wherein the pad electrode comprises a first pad electrode and a second pad electrode, wherein an orthographic projection of the first pad electrode on the substrate does not overlap with an orthographic projection of the second pad electrode on the substrate, and a corresponding second scan line is provided between the first pad electrode and the second pad electrode.

13. The display device according to claim 12, wherein the common electrode comprises a first common electrode and a second common electrode, an orthographic projection of the first common electrode on the substrate overlaps with an orthographic projection of the first pad electrode on the substrate, and an orthographic projection of the second common electrode on the substrate overlaps with an orthographic projection of the second pad electrode on the substrate.

14. The display device according to claim 12, wherein each of the pixel structures further comprises:
   a gate insulating layer, covering a gate of the first active device, a gate of the second active device, and the pad electrode, wherein the gate insulating layer comprises a first gate insulating layer opening exposing a portion of the first pad electrode and a second gate insulating layer opening exposing a portion of the second pad electrode; and
   a connecting electrode, disposed on the gate insulating layer and electrically connected to a drain of the second active device, wherein the connecting electrode is connected to the first pad electrode through the first gate insulating layer opening and connected to the second pad electrode through the second gate insulating layer opening.

15. The pixel array substrate according to claim 14, wherein each of the pixel structures further comprises:
   a protective layer, covering the first active device and the second active device and having a protective layer opening, wherein the pixel electrode is electrically connected to the connecting electrode through the protective layer opening.

16. The display device according to claim 15, wherein the protective layer comprises a first protective layer opening, disposed above the first gate insulating layer opening, and a second protective layer opening, disposed above the second gate insulating layer opening.

17. The display device according to claim 14, wherein the connecting electrode and the drain of the second active device are integrated.

18. The pixel array substrate according to claim 14, wherein the second scan line correspondingly connected to each of the pixel structures is disposed between the first gate insulating layer opening and the second gate insulating layer opening.

* * * * *